United States Patent [19]
Sukegawa et al.

[11] Patent Number: 5,805,522
[45] Date of Patent: Sep. 8, 1998

[54] ADDRESS ACCESS PATH CONTROL CIRCUIT

[75] Inventors: Shunichi Sukegawa, Tsukuba; Koichi Abe, Tokyo; Makoto Saeki, hamura; Yukihide Suzuki, Akishima, all of Japan

[73] Assignee: Texas Insturments Incorporated, Dallas, Tex.

[21] Appl. No.: 706,373

[22] Filed: Aug. 30, 1996

[30] Foreign Application Priority Data

Sep. 1, 1995 [JP] Japan .................................. 7-225345

[51] Int. Cl.$^6$ .................................. G11C 8/00; G11C 7/00
[52] U.S. Cl. .............................. 365/230.03; 365/230.06; 365/230.08; 365/201; 365/233.5
[58] Field of Search ......................... 365/230.03, 230.06, 365/230.08, 233.5, 201, 189.05

[56] References Cited

U.S. PATENT DOCUMENTS

| | | | |
|---|---|---|---|
| 4,384,347 | 5/1983 | Nakano | 365/230.03 |
| 4,855,957 | 8/1989 | Nogami | 365/230.03 |
| 5,280,456 | 1/1994 | Okajima et al. | 365/230.03 |
| 5,289,431 | 2/1994 | Konishi | 365/230.03 |
| 5,444,305 | 8/1995 | Matsui | 365/230.03 |
| 5,502,675 | 3/1996 | Kohno et al. | 365/230.03 |

*Primary Examiner*—David C. Nelms
*Assistant Examiner*—Trong Phan
*Attorney, Agent, or Firm*—Gerald E. Laws; William B. Kempler; Richard L. Donaldson

[57] ABSTRACT

An address access path control circuit designed for shorter access time and small the layout area with low power consumption and noise. Our control circuit has a latching circuit LMO2A, a main output circuit MO3, and a common-bus driving circuit CBD for holding the level of a pair of common-buses CB/CB_ at the ground level during a pre-scribed period of time in which address transition takes place while the read data is output to common-buses CB/CB_ at a timing corresponding to the address signal. A data output buffer DO-BUF outputs to the outside the data transmitted from common-buses CB/CB_ to data output lines OD/OD_ in response to the input of control signal DOE. A control signal DOE is input to data output buffer DO-BUF during the period in which data output lines OD/OD_ are at the ground level.

7 Claims, 11 Drawing Sheets

ADDRESS ACCESS PATH CONTROL CIRCUIT

FIELD OF THE INVENTION

Our invention relates to a control circuit for controlling the address access path in dynamic random access memories (DRAMs) and other semiconductor memory devices.

BACKGROUND OF THE INVENTION

FIG. 6 is a block diagram of a conventional address access path control circuit used for DRAMs. The memory array of a DRAM illustrated in FIG. 6 consists of (M+1) units (from unit 0 to unit M) of memory blocks $MB_0$–$MB_M$. Each of memory blocks $MB_0$–$MB_M$ consists of (N+1) units (from unit 0 to unit N) of subarrays $SBA_0$–$SBA_N$. Various subarrays $SBA_0$–$SBA_N$ are separated from each other by sense amplifier banks $S/AB_0$–$S/AB_{N+1}$.

Sense amplifier banks $S/AB_0$–$S/AB_{N+1}$ are formed by arranging sense amplifiers in a so-called zigzagging manner on both sides of the subarrays. The sense amplifiers in each of sense amplifier banks $S/AB_1$–$S/AB_N$, that is, all of the sense amplifier banks except for $S/AB_0$ and $S/AB_{N+1}$ are shared by two adjacent subarrays.

One of the (N+1) units of row decoders X-$DEC_0$–X-$DEC_N$ is selected according to the address fetched at the timing of external input signal RAS_. Also, one of the word lines in the selected row decoder is selected and enabled.

In column decoder Y-DEC, the transition of the external address after fetch of the row address is fetched, and the YS signal of the designated address is synchronized with the internal timing block generated by an ATD (address transition detector) circuit, not of the figure, and is enabled. According to the YS signal, one sense amplifier is selected from sense amplifier bank S/AB, and the data on a bit line, not of the figure, is sent to local input/output lines LIO and LIO_.

Input/output switches $IOSW_0$–$IOSW_{N+1}$1 are arranged such that they respectively correspond to the various sense amplifier banks $S/AB_0$–$S/AB_{N+1}$. Input/output switches IOSW corresponding to sense amplifier banks S/AB on both sides of the enabled subarray are turned on. Main input/output lines $MIO_0$, $MIO_{0\_}$, $MIO_1$, and $MIO_{1\_}$ connected to local input/output lines LIO, LIO_, and main amplifier MA are maintained in an electrically connected state.

Also, local input/output lines with even-numbered subscripts $LIO_0$, $LIO_2$, ..., $LIO_N$ and $LIO_{0\_}$, $LIO_{2\_}$, ..., $LIO_{N\_}$ are connected to main input/output lines $MIO_0$ and $MIO_{0\_}$, respectively. Local input/output lines $LIO_1$, $LIO_3$, ..., $LIO_{N+1}$, and $LIO_{1\_}$, $LIO_{3\_}$, ..., $LIO_{N+1\_}$ are respectively connected to main input/output lines $MIO_1$ and $MIO_{1\_}$.

Main amplifiers $MA_0$ and $MA_1$ amplify the signals that are output from the memory array and transmitted to main input/output lines $MIO_0$, $MIO_{0\_}$, $MIO_1$, and $MIO_{1\_}$.

As far as the main amplifiers are concerned, two main amplifiers $MA_0$ and $MA_1$ are arranged such that they respectively correspond to the complementary signals of main input/output lines $MIO_0$ and $MIO_1$.

Memory block (O) MBO in FIG. 6 shows that signals MAD and MAE generated by the ATD circuit, not of the figure, are input to main amplifiers $MA_0$ and $MA_1$, respectively.

FIG. 7 is a schematic of a configuration example of main amplifier MA.

As shown in FIG. 7, the main amplifier MA consists of p-channel MOS (referred to as PMOS hereinafter) transistors MP0–MP12, n-channel MOS (referred to as NMOS hereinafter) transistors MN0–MN10, and inverter INV0.

The sources/drains of PMOS transistor MP0 and NMOS transistor MN0 are connected the sources/drains of PMOS transistor MP6 and NMOS transistor MN6 connected, and the sources/drains of PMOS transistor MP12 and NMOS transistor MN10 are connected to form transmission gates TG1, TG2, and TG3 for equalization. Signal MAEQ is sent to the gates of NMOS transistors MN0, MN6, and MN10, and signal MAEQ_ obtained by inverting signal MAEQ using inverter INV0 is sent to the gates of PMOS transistors MP0, MP6, and MP12.

One input/output terminal of transmission gate TG1 is connected to main input/output line MIO_ and the gates of NMOS transistors MN1 and MN3. The other input/output terminal of transmission gate TG1 is connected to main input/output line MIO and the gates of NMOS transistors MN2 and MN4.

One input/output terminal of transmission gate TG2 is connected to connection point N3 between the drains of PMOS transistor MP1 and NMOS transistor MN1, the drain of PMOS transistor MP5, and the gate of NMOS transistor MN7. The other input/output terminal of transmission gate TG2 is connected to connection point N4 between the drains of PMOS transistor MP4 and NMOS transistor MN4, the drain of PMOS transistor MP7, and the gate of NMOS transistor MN8.

One input/output terminal of transmission gate TG3 is connected to connection point N6 between the drains of PMOS transistor MP8 and NMOS transistor MN7, the drain of PMOS transistor MP10, and main output line MO_. The other input/output terminal of transmission gate TG3 is connected to connection point N7 between the drains of PMOS transistor MP9 and NMOS transistor MN8, the drain of PMOS transistor MP11, and main output line MO.

Transmission gates TG1, TG2, and TG3 are set to equalize the input and output stages of main amplifier MA based on the input of signal MAEQ.

The sources of PMOS transistors MP5, MP7, MP10, and MP11 are connected to the supply line for supply voltage $V_{DD}$, and their gates are connected to the input line of signal MAD. The PMOS transistors MP5, MP7, MP10, and MP11 act as transistors for precharging, and main amplifier MA is enabled by signal MAD.

The sources of NMOS transistors MN1, MN2, MN3, and MN4 are connected, and connection point N5 is connected to the drain of NMOS transistor MN5. The source of NMOS transistor MN5 is connected to the ground line, and its gate is connected to the input line of signal MAD.

The drains of PMOS transistor MP2 and NMOS transistor MN2 are connected, and their connection point is connected to the gates of PMOS transistors MP1 and MP2. The sources of PMOS transistors MP1 and MP2 are connected to the supply line for supply voltage $V_{DD}$. In this way, differential amplifier AP1 is formed.

Similarly, the drains of PMOS transistor MP3 and NMOS transistor MN3 are connected, and their connection point is connected to the gates of PMOS transistors MP3 and MP4. The sources of PMOS transistors MP3 and MP4 are connected to the supply line for supply voltage $V_{DD}$. In this way, differential amplifier AP2 is formed.

The differential amplifiers AP1 and AP2 are connected in parallel with respect to main input/output lines MIO and MIO_, and input stage buffer BUFI is formed.

Also, the sources of PMOS transistors MP8 and MP9 are connected to the supply line for supply voltage $V_{DD}$. The sources of NMOS transistors MN7 and MN8 are connected, and their connection point N8 is connected to the drain of NMOS transistor MN9. The source of NMOS transistor MN9 is connected to the ground line, and its gate is connected to the input line of signal MAD. Connection node N6 is connected to the gate of PMOS transistor MP9, and node N7 is connected to the gate of PMOS transistor MP8.

Output stage buffer BUFO is composed of the transistors MP8, MP9, MN7, MN8, and MN9.

Main amplifier MA with the configuration amplifies the signals with very low amplitudes that have been transmitted to main input/output lines MIO and MIO_ and outputs the signals to main output lines MO and MO_.

Latching circuits $LMO2_0$ and $LMO2_1$ latch the signals output from main amplifier MA to main output lines MO and MO_.

FIG. 8 is a schematic of a configuration example of latching circuit LMO2.

As shown in FIG. 8, the latching circuit LMO2 consists of PMOS transistors MP13—MP16 and NMOS transistors MN11–MN14.

The gate of PMOS transistor MP13 and the gate of NMOS transistor N11 are connected to main output line MO. The drains of the two transistors MP13 and MN11 and the drain of PMOS transistor MP14 are connected. Their connection point is connected to the gates of PMOS transistor MP16 and NMOS transistor MN14 and main output line MO2_. The sources of PMOS transistors MP13 and MP14 are connected to the supply line for supply voltage $V_{DD}$. The source of NMOS transistor MN11 is connected to the drain of NMOS transistor MN12, and the source of NMOS transistor MN12 is connected to the ground line.

The gates of PMOS transistor MP15 and NMOS transistor MN13 are connected to main output line MO_. The drains of the two transistors MP15 and MN13 and the drain of PMOS transistor MP16 are connected. Their connection point is connected to the gates of PMOS transistor MP14 and NMOS transistor MN12 and main output line MO2. The sources of PMOS transistors MP15 and MP16 are connected to the supply line for supply voltage $V_{DD}$. The source of NMOS transistor MN13 is connected to the drain of NMOS transistor MN14, and the source of NMOS transistor MN14 is connected to the ground line.

Latching circuit LMO2 has the so-called NAND circuit's cross latching structure and outputs complementary signals to main output lines MO2 and MO2_.

Common-bus driving circuit CBD is a tristate driver for driving common-buses CB and CB_ acting as the global input/output lines. During the normal read operation, when the driver is selected by signals MAS and CBS, decoded depending on the column address, the signals on output lines MO2 and MO2_ are transmitted to common-buses CB and CB_, respectively.

FIG. 9 is a schematic of common-bus driving circuit CBD having PMOS transistors MP17–MP24, NMOS transistors MN14–MN21, three-input NAND gate NA0, and inverters INV1 and INV2. The sources/drains of PMOS transistor MP17 and NMOS transistor MN14 are connected; the sources/drains of PMOS transistor MP18 and NMOS transistor MN15 are connected; the sources/drains of PMOS transistor MP19 and NMOS transistor MN16 are connected; and the sources/drains of PMOS transistor MP20 and NMOS transistor MN17 are connected. In this way, transmission gates TG4, TG5, TG6, and TG7 are formed. The gates of PMOS transistors MP17–MP20 are connected to the output of NAND gate NA0, and the gates of NMOS transistors MN14–MN17 are connected to the output of inverter INV2, which is connected to the output of NAND gate NA0.

One input/output terminal of transmission gate TG4 and one input/output terminal of transmission gate TG5 are connected to main output line MO2. One input/output terminal of transmission gate TG6 and one input/output terminal of transmission gate TG7 are connected to main output line MO2_. The other input/output terminal of transmission gate TG4 is connected to the drain of PMOS transistor MP21 and the gate of PMOS transistor MP23. The other input/output terminal of transmission gate TG5 is connected to the drain of NMOS transistor MN18 and the gate of NMOS transistor MN20. The other input/output terminal of transmission gate TG6 is connected to the drain of PMOS transistor MP22 and the gate of PMOS transistor MP24. The other input/output terminal of transmission gate TG7 is connected to the drain of NMOS transistor MN19 and the gate of NMOS transistor MN21.

The sources of PMOS transistors MP21–MP24 are connected to the feeding line for supply voltage $V_{DD}$, and the sources of NMOS transistors MN18–MN21 are connected to the ground line.

The gates of PMOS transistors MP21 and MP22 are connected to the output of inverter INV2, and the gates of NMOS transistors MN18 and MN19 are connected to the output of NAND gate NA0.

The drains of PMOS transistor MP23 and NMOS transistor MN20 are connected to form an inverter, and their connection point is connected to common-bus CB_. Also, the drains of PMOS transistor MP24 and NMOS transistor MN21 are connected to form an inverter, and their connection point is connected to common-bus CB.

The three inputs of NAND gate NA0 are connected to the input line of signal CBS, the input line of signal MAS, and the output of inverter INV1, respectively. The input of inverter INV1 is connected to the input line of test signal TEST.

Common-bus driving circuit CBD inverts the level of the signal on main input line MO2 and outputs the signal to common-bus CB_. Also, common-bus driving circuit CBD inverts the level of the signal on main output line MO2_ and outputs the signal to common-bus CB.

During a read operation in the test mode, common-bus driving circuit CMP transmits the signals on main output lines MO2 and MO2_ to common-buses CB and CB_, respectively.

FIG. 10 is a schematic of common-bus driving circuit CMP which has nearly the same configuration as common-bus driving circuit CBD of FIG. 9.

However, one input/output terminal of transmission gate TG4 and one input/output terminal of transmission gate TG5 are connected to the input of two-output NAND gate NA1. One input/output terminal of transmission gate TG6 and one input/output terminal of transmission gate TG7 are connected to the output of two-input NAND gate NA2.

One input of NAND gate NA1 is connected to main output line $MO2_0$, while the other input is connected to main output line $MO2_1$. One input of NAND gate NA2 is connected to main output line $MO2_0$, while the other input is connected to main output line $MO2_1$.

Also, two-input NAND gate NA3 is used instead of three-input NAND gate NA0. One input of NAND gate NA3 is connected to the input line of signal TEST, while the other input is connected to the input line of signal CBS.

Latching circuit ODL is used to latch the signals transmitted on common-buses CB and CB__. The timing of latching is controlled by signal OLB generated by an ATD circuit, not of the figure.

FIG. 11 is a schematic of a configuration example of latching circuit ODL.

The latching circuit ODL consists of PMOS transistors MP25–MP32, NMOS transistors MN22–MN33, and inverters INV3–INV5 connected in series.

The sources/drains of PMOS transistor MP25 and NMOS transistor MN22 are connected, and the sources/drains of PMOS transistor MP26 and NMOS transistor MN23 are connected. In this way, transmission gates TG8 and TG9 are formed. The gates of PMOS transistors MP25 and MP26 are connected to the output of inverter INV3, and the gates of NMOS transistors MN22 and MN23 are connected to the output of inverter INV4.

One input/output terminal of transmission gate TG8 is connected to common-bus CB. The other input/output terminal is connected to data output line OD, the gates of PMOS transistor MP27 and NMOS transistor MN24, the connection point between the drains of PMOS transistor MP29 and NMOS transistor MN25, and the source of NMOS transistor MN30.

One input/output terminal of transmission gate TG9 is connected to common-bus CB__. The other input/output terminal is connected to data output line OD__, the gates of PMOS transistor MP30 and NMOS transistor MN27, the connection point between PMOS transistor MP32 and NMOS transistor MN28, and the source of NMOS transistor MN33.

The source of PMOS transistor MP27 is connected to the feeding line for supply voltage $V_{DD}$, and the source of NMOS transistor MN24 is connected to the ground line. The drains of the two transistors MP27 and MN24 are connected, and the connection point is connected to the gates of PMOS transistor MP28 and NMOS transistor MN26. The source of PMOS transistor MP28 is connected to the feeding line for supply voltage $V_{DD}$, and its drain is connected to the source of PMOS transistor MP29. Also, the source of NMOS transistor MN26 is connected to the ground line, and its drain is connected to the source of NMOS transistor MN25.

Similarly, the source of PMOS transistor MP30 is connected to the feeding line for supply voltage $V_{DD}$, and the source of NMOS transistor MN27 is connected to the ground line. The drains of the two transistors MP30 and MN27 are connected, and the connection point is connected to the gates of PMOS transistor MP31 and NMOS transistor MN29. The source of PMOS transistor MP31 is connected to the feeding line for supply voltage $V_{DD}$, and its drain is connected to the source of PMOS transistor MP32. Also, the source of NMOS transistor MN29 is connected to the ground line, and its drain is connected to the source of NMOS transistor MN28.

The gates of PMOS transistors MP29 and MP32 are connected to the output of inverter INV4, and the gates of NMOS transistors MN25 and MN28 are connected to the output of inverter INV5.

Also, the source of NMOS transistor MN31 is connected to the drain of NMOS transistor MN30. The source of NMOS transistor MN32 is connected to the drain of NMOS transistor MN33. The drains of NMOS transistors MN31 and MN32 are connected, and the connection point is connected to the ground line. The gate of NMOS transistor MN30 is connected to data output line OD__. The gate of NMOS transistor MN33 is connected to data output line OD.

The gates of NMOS transistors MN31 and MN32 are connected to the output of inverter INV5.

The input of inverter INV3 is connected to the input line of signal OLB.

In the latching circuit ODL, when signal OLB is input at the high level, transmission gates TG8 and TG9 are turned on. The signals on common-buses CB and CB__ are held at their levels and are transmitted to data output lines OD and OD__, respectively. For example, when the signals on common-buses CB and CB__ are input at the high level and low level, respectively, and when signal OLB goes to the low level, PMOS transistors MP28 and MP29 are turned on, and the signal is held at the $V_{DD}$ level (high level) on the side of data output line OD. Also, NMOS transistors MN28 and MN29 is turned on, and the signal is held at the ground level (low level) on the side of data output line OD__.

Data output buffer DO-BUF is a tristate output buffer. The high impedance (HI-Z) state is controlled by signal DOE generated by an ATD circuit or by an external clock CAS__.

FIG. 12 is a schematic of a configuration example of data output buffer DO-BUF.

The data output buffer DO-BUF consists of PMOS transistor MP33, NMOS transistor MN34, two-input NAND gates NA4 and NA5, and inverter INV6.

One input of NAND gate NA4 is connected to data input line OD, while the other input is connected to the input line of signal DOE. The output of NAND gate NA4 is connected to the gate of PMOS transistor MP33.

One input of NAND gate NA5 is connected to data output line OD__, while the other input is connected to the input line of signal DOE. The output of NAND gate NA5 is connected to the input of inverter INV6. The output of inverter INV6 is connected to the gate of NMOS transistor MN34.

The source of PMOS transistor MP33 is connected to the feeding line for supply voltage $V_{DD}$. The source of NMOS transistor MN34 is connected to the ground line. The drains of the two transistors MP33 and MP34 are connected, and the connection of the drains is connected to data output line DOUT.

Corresponding to the input level of signal DOE, the data output buffer DO-BUF performs output control for the signals on data output lines OD and OD__ and performs high impedance control for output line DOUT.

In the following, the operation of the device of FIG. 6 will be explained with reference to the timing chart of FIG. 13.

For example, in memory block $MB_0$, when subarray $SBA_0$ is selected according to the row address, one word line not of the figure is enabled in row decoder $X-DEC_0$. Also, sense amplifier banks $S/AB_0$ and $S/AB_1$ are enabled, and the data in the memory cells is amplified.

According to the column address, one YS line is enabled in column decoder Y-DEC, and one sense amplifier is selected from each of sense amplifier banks $S/AB_0$ and $S/AB_1$.

Data is transmitted from the selected sense amplifiers to local input/output lines $LIO_0/LIO_0\_$ and $LIO_0/LIO_1\_$ having complementary levels, respectively. The data passes through input/output switches $IOSW_0$ and $IOSW_1$ enabled according to the row address and is transmitted to main input/output lines $MIO_0/MIO_0\_$ and $MIO_1/MIO_1\_$, respectively.

In this case, depending on the transition of the column address, main amplifiers $MA_0$ and $MA_1$ are enabled by signal MAD generated by an ATD circuit, not of the figure. Also, the input and output stages for both enabled main amplifiers $MA_0$ and $MA_1$ are equalized by signal MAEQ generated by the ATD circuit. As a result, main output lines $MO_0/MO_{0\_}$ and $MO_1/MO_{1\_}$ of main amplifiers MA are kept from oscillating and wait for input of the signals transmitted on main input/output lines $MIO_0/MIO_{0\_}$ and $MIO_1/MIO_{1\_}$.

Signal MAEQ is disabled once the input timing of the signals transmitted on main input/output lines $MIO_0/MIO_{0\_}$ and $MIO_1/MIO_{1\_}$ is discerned. In this way, main output lines $MO_0/MO_{0\_}$ and $MO_1/MO_{1\_}$ of main amplifiers MA oscillate, and the data is latched into latching circuits $LMO2_0$ and $LMO2_1$.

For example, if signals $MAS_0$ and $CBS_0$ are selected according to the column address, the complementary signals transmitted on main output lines $MO2_0/MO2_{0\_}$ of latching circuit $LMO2_0$ are output to common-buses CB/CB__ acting as the global input/output lines with the aid of common-bus driving circuit CBD.

In the first page mode, signal OLB is enabled by RAS__. As a result, the signals transmitted on common-buses CB/CB__ are transferred to data output lines OD/OD__ through latching circuit ODL.

When the setup time for CAS__ and external address transition is very short, signal DOE is controlled by the ATD circuit and is enabled in accordance with the timing as the complementary signals transmitted on common-buses CB/CB__ are transferred to data output lines OD/OD__.

When signal DOE is enabled, the data signals transmitted on data output lines OD/OD__ are output to the outside by data output buffer DO-BUF.

FIG. 14 is a timing chart of an operation, which is basically the same as FIG. 13 except that signal MAS is transmitted depending on the column address. Also, as far as the complementary signals are concerned, the TRUE signal is represented by a solid line, while the BAR signal is represented by a broken line.

In the operation example of FIG. 14, before address transition takes place, main output lines $MO2_{0\_}$ and $MO2_1$ are latched to the high level "H," while main output lines $MO2_0$ and $MO2_{1\_}$ are latched to the low level "L." Signal $MAS_1$ is selected and goes to the high level "H."

Consequently, the data on main output lines $MO2_1/MO2_{1\_}$ are transmitted to common-bus CB and to data output line OD. Common-bus CB and data output line OD are set at the high level "H," while common-bus CB__ and data output line OD__ are set at the low level "L."

In this case, when address transition takes place, signal $MAS_1$ goes to the low level "L" and is not selected. Signal $MAS_0$ goes to the high level "H" and is selected. The data signals transmitted on main output lines $MO2_0/MO2_{0\_}$ are transferred to data output line OD. The data on common-buses CB/CB__ and on data output lines OD/OD__ is respectively inverted.

Then, the data read from memory cells inverts the levels of main output lines MO2/MO2__ depending on the operation of main amplifiers MA. Consequently, the levels of common-buses CB/CB__ and data output lines OD/OD__ are again inverted.

However, the address access path control circuit has the following problems.

The load capacities of common-buses CB/CB__ are large due to the junction capacitance of the tristate drivers of common-bus driving circuits CMP and CBD. Also, because there are many common-bus driving circuits CMP and CBD, the layout area of the circuits CMP and CBD takes up a large proportion of the area.

Signal DOE must be enabled after the complementary signals are output to data output lines OD/OD__. However, the time difference in the transmission of these two signals depends significantly on the temperature and supply voltage. Consequently, the timing margin must be increased. As a result, the access time is prolonged.

In the operation example of FIG. 13, signal MAS is handled in an unchanged state. However, as shown in FIG. 14, when signal MAS is transmitted depending on the column address, unnecessary transition takes place in common-buses CB/CB__ and in data output lines OD/OD__. Consequently, unwanted noise is generated, and the power consumption is increased, which are disadvantages.

The purpose of our invention is to solve the problems with the conventional method by providing an address access path control circuit that provides the following effects: the access time can be shortened and the layout area can be decreased; furthermore, the power consumption can be reduced, and the noise can be decreased.

SUMMARY OF INVENTION

In order to realize the purpose, our invention provides a address access path control circuit characterized by the fact that, with a memory array divided into a number of blocks, the address access path control circuit is used to perform the control operation for outputting the data, which is read in a complementary manner from the memory cells of an addressdesignated memory block, to the exterior through a pair of common-buses shared by the various blocks and through a pair of data output lines branched from the common-buses; the address access path control circuit has the following parts: a circuit, which holds the level of the pair of common-buses at a standard level during a prescribed period of time in which address transition takes place while the read data is output to the common-buses at a timing corresponding to the address signal, and an output circuit, which outputs to the outside the data transmitted from the common-buses to the data output lines in response to the input of a control signal.

Also, input of the control signal to the output circuit is carried out during the period of time in which the level of the data output lines is held at the standard level.

According to our invention, after the data read from the memory cells of the address-designated memory block in a complementary manner is amplified by the main amplifiers, it is transmitted to the common-buses. Then, the data is transmitted to the data output lines and output to the outside through the output circuit in response to the input of the control signal.

In this case, when address transition takes place, the level of the common-buses is held at a standard level for a prescribed period of time. During this period, the control signal is input to the output circuit.

After this, the data is output in the normal manner.

In the Figures, $MB_0$–$MB_M$ are memory blocks, $SBA_0$–$SBA_N$ subarrays, $S/AB_0$–$S/AB_{N+1}$ sense amplifier banks, $X$-$DEC_0$–$X$-$DEC_N$ row decoders, Y-DEC column decoders, $LIO_0$–$LIO_{N+1}$, $LIO_{0\_}$–$LIO_{N+1}$ local input/output lines, $IOSW_0$–$IOSW_{N+1}$ input/output switches, $MIO_0$, $MIO_{0\_}$, $MIO_1$, $MIO_{1\_}$ main input/output lines, $MO_0$, $MO_{0\_}$, $MO_1$, $MO_{1\_}$, $MO2_0$, $MO2_{0\_}$, $MO2_1$, $MO2_{1\_}$, $MO3$, $MO3_\_$ main output lines, MA main amplifier, LMO2A latching circuit, MO3 main output circuit, CBD common-bus driving circuit, CB, CB_ common-buses, ODL latching circuit, OD, OD_ data output line, DO-BUF data output buffer, and DOUT is an output line.

DETAILED DESCRIPTION

Figure 1:
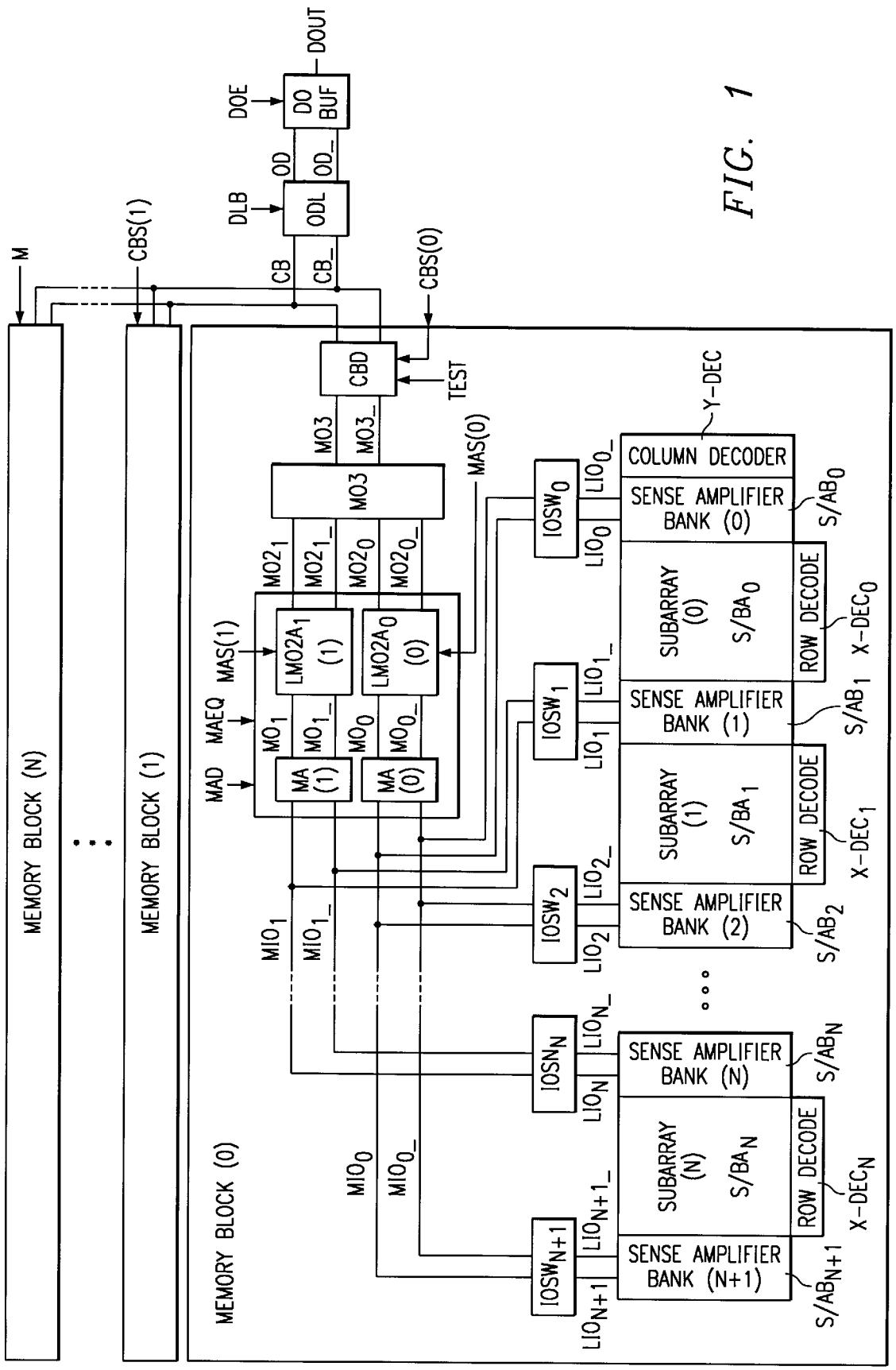
FIG. 1 is a block diagram of an embodiment of an address access path control circuit for DRAMs according to our invention.

FIG. 1 is a block diagram of an embodiment of an address access path control circuit according to our invention. The components that are the same as those the conventional example of FIG. 6 have the same reference numerals.

Figure 6:
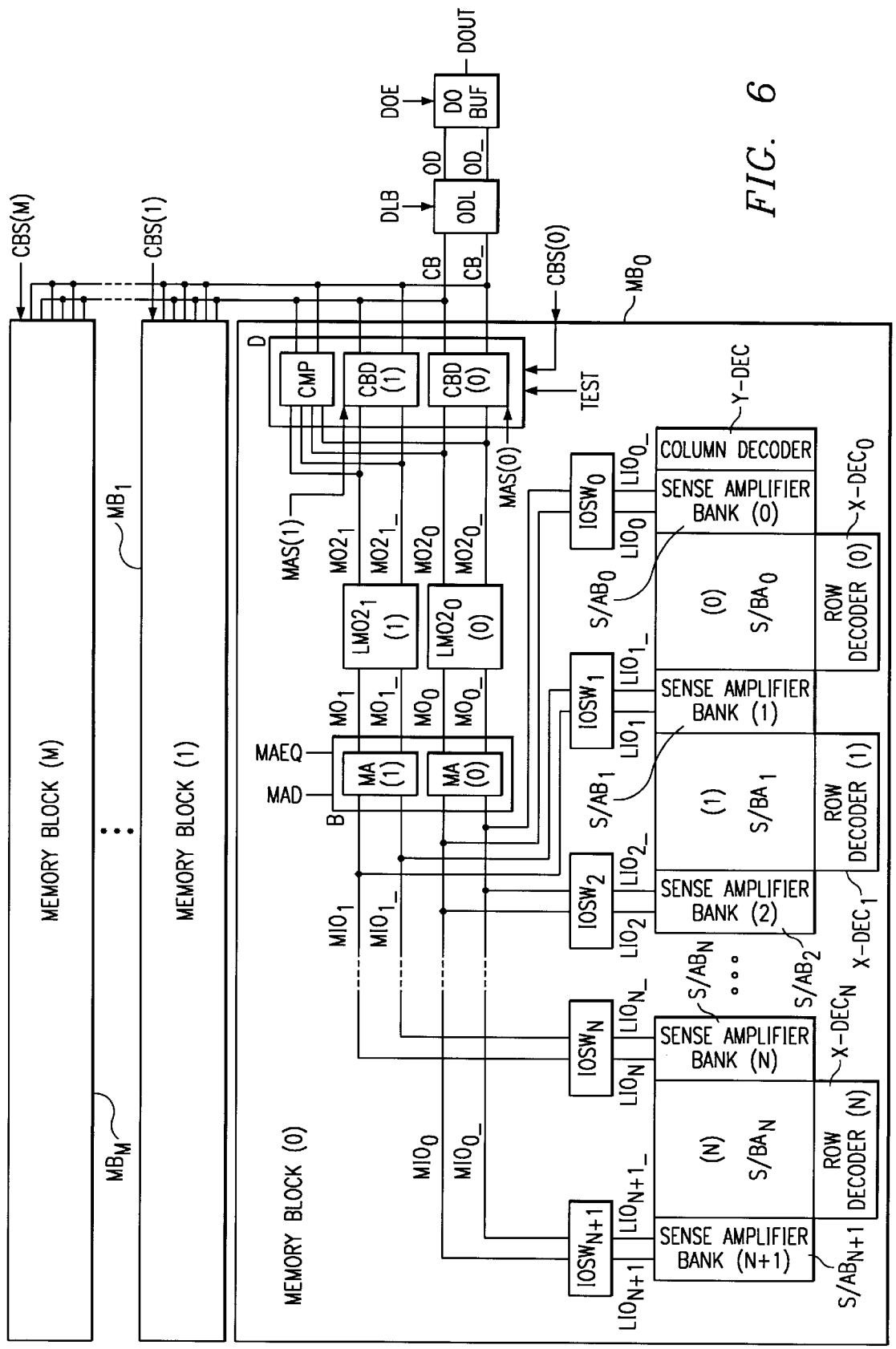
FIG. 6 is a block diagram of a conventional address access path control circuit for conventional DRAMs.
Figure 7:
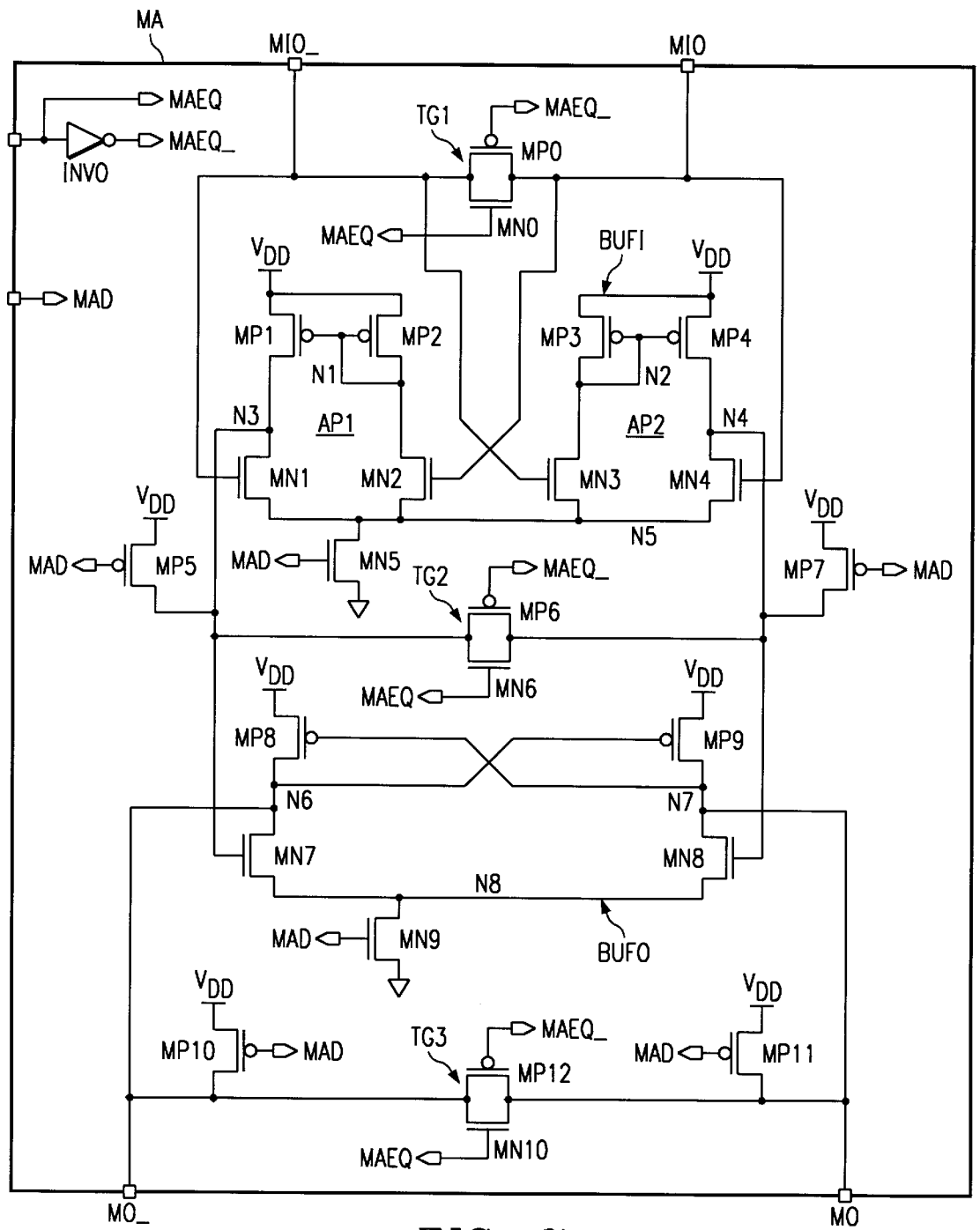
FIG. 7 is a schematic of a main amplifier.
Figure 8:
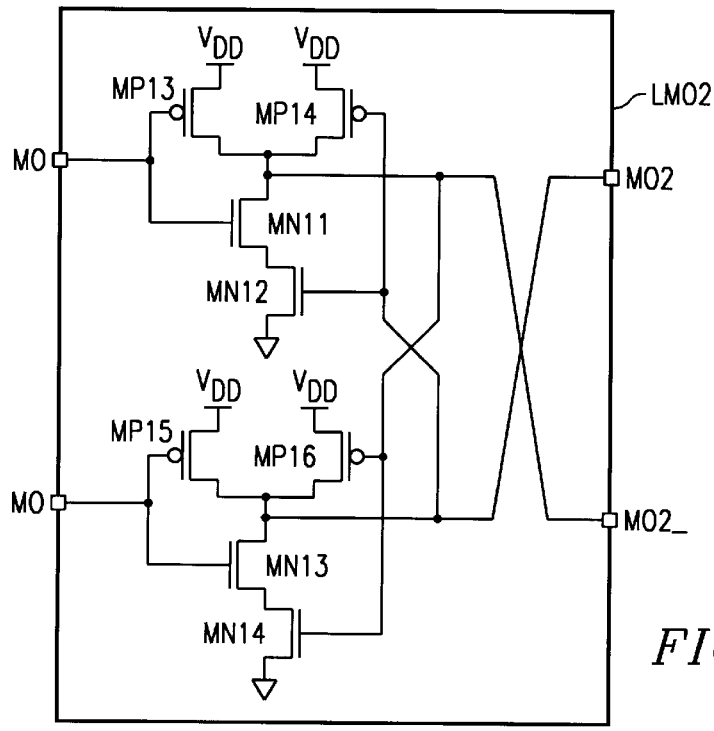
FIG. 8 is a schematic of a latching circuit LMO2 used in the circuit of FIG. 6.

This embodiment differs from the conventional example of FIG. 6 in the following respects. Latching circuit LMO2A differs from that used in the conventional example, and main output circuit MO3 is added. Also, instead of three common-bus driving circuits $CBD_0$, $CBD_1$, and CMP of FIG. 6, we use only one common-bus driving circuit CBD. The number of circuits is reduced, and the load capacity of common-buses CB/CB_ is also reduced.

Latching circuits $LMO2A_0$ and $LMO2A_1$ latch the signals output from main amplifiers MA to main output lines MO and MO_. Then, latching circuits $LMO2A_0$ and $LMO2A_1$ output the signals to main output lines $MO2_0$ and $MO2_{0\_}$, as well as $MO2_1$ and $MO2_{1\_}$, respectively.

Figure 2:
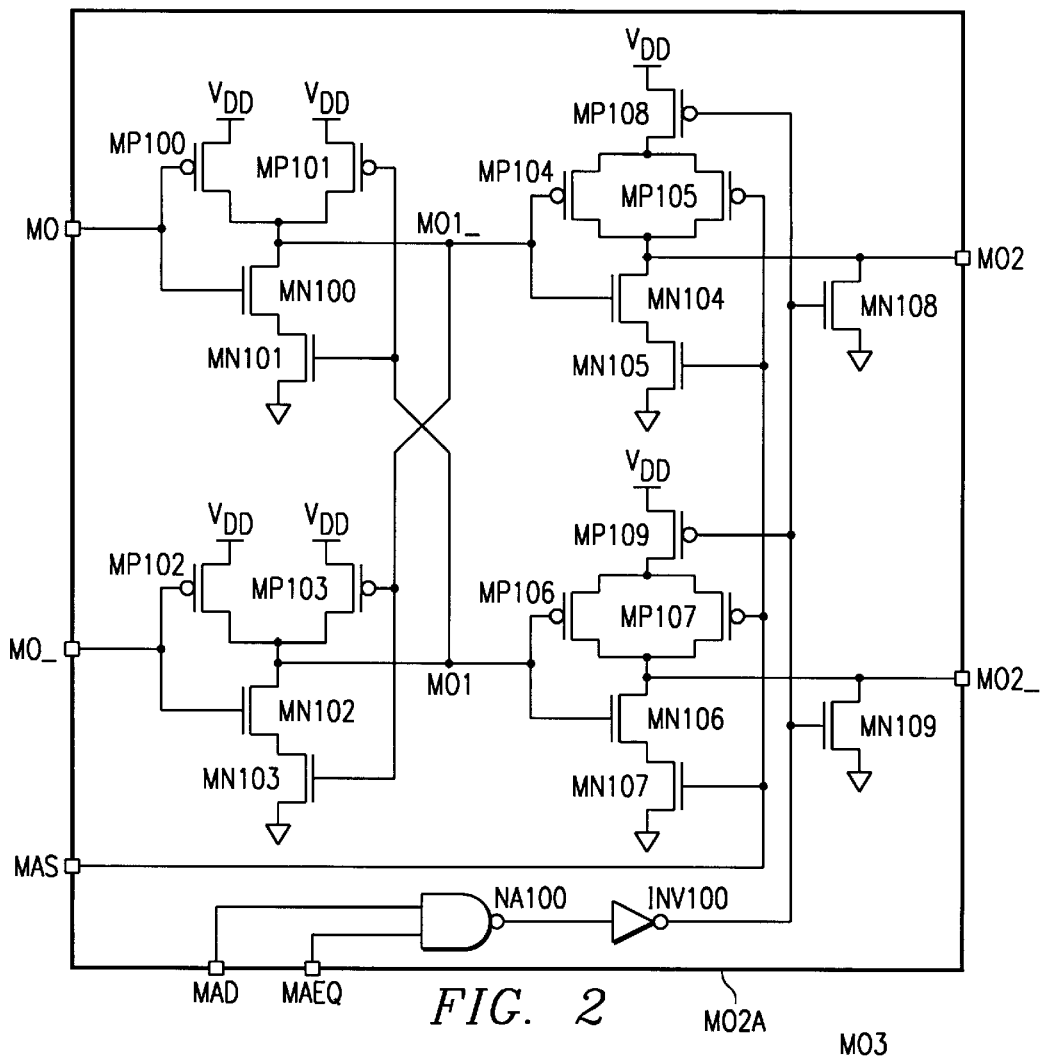
FIG. 2 is a schematic of a latching circuit LMO2A used in the circuit of FIG. 1.

FIG. 2 is a schematic of a latching circuit LMO2A having PMOS transistors MP100–MP109, NMOS transistors MN100–MN109, two-input NAND gate NA100, and inverter INV100. The gates of transistors MP100 and MN100 are connected to main output line MO. The drains of transistors MP100 and MN100 and the drain of transistor MP101 are connected. The connection point between the drains is connected to the gates of transistors MP103 and MN103 and main output line MO1_. The sources of transistors MP100 and MP101 are connected to the feeding line for supply voltage $V_{DD}$. The source of transistor MN100 is connected to the drain of transistor MN101, and the source of transistor MN101 is connected to the ground line.

The gate of PMOS transistor MP102 and the gate of NMOS transistor MN102 are connected to main output line MO_. The drains of the two transistors MP102 and MN102 and the drain of PMOS transistor MP103 are connected. The connection point between the drains is connected to the gates of PMOS transistor MP101 and NMOS transistor MN101 and main output line MO1. The sources of PMOS transistors MP102 and MP103 are connected to the feeding line for supply voltage $V_{DD}$. The source of NMOS transistor MN102 is connected to the drain of NMOS transistor MN103, and the source of NMOS transistor MN103 is connected to the ground line.

Main output line MO1_ is connected to the gates of PMOS transistor MP104 and NMOS transistor MN104. Main output line MO1 is connected to the gates of PMOS transistor MP106 and NMOS transistor MN106.

The sources of PMOS transistors MP104 and MP105 are connected to the drain of PMOS transistor MP108, and the source of PMOS transistor MP108 is connected to the feeding line for supply voltage $V_{DD}$. The drains of PMOS transistors MP104 and MP105 and the drain of NMOS transistor Mn104 are connected. The connection point between the drains is connected to the drain of NMOS transistor MN108 and the main output line MO2. The source of NMOS transistor MN104 is connected to the drain of NMOS transistor MN105, and the source of NMOS transistor MN105 is connected to the ground line.

The sources of PMOS transistors MP106 and MP107 are connected to the drain of PMOS transistor MP109, and the source of PMOS transistor MP109 is connected to the feeding line for supply voltage $V_{DD}$. The drains of PMOS transistors MP106 and MP107 and the drain of NMOS transistor MN106 are connected. The connection point between the drains is connected to the drain of NMOS transistor MN109 and main output line MO2_. The source of NMOS transistor MN106 is connected to the drain of NMOS transistor MN107, and the source of NMOS transistor MN107 is connected to the ground line.

The gates of PMOS transistors MP105 and MP107 and the gates of NMOS transistors MN105 and MN107 are connected to the input line of signal MAS. The gates of PMOS transistors MP108 and MP109 and the gates of NMOS transistors MN108 and MN109 are connected to the output of inverter INV100. The input of inverter INV100 is connected to the output of NAND gate NA100. One input of NAND gate NA100 is connected to the input line of signal MAD, while the other is connected to the input line of signal MAEQ.

For latching circuit LMO2A with the configuration, the NAND circuit, which has the so-called cross latching structure and forms the input stage, and the NAND circuit forming the output stage are concatenated through main output lines MO1_ and MO1. The signals transmitted on main output lines MO and MO_ are output to main output lines MO2 and MO2_ in phase.

Main output circuit MO3 is used to output the signals, which are output from latching circuits $LMO2A_0$ and $LMO2A_1$ to main output lines $MO2_0$ and $MO2_1$, to main output lines MO3 and MO3_.

Figure 3:
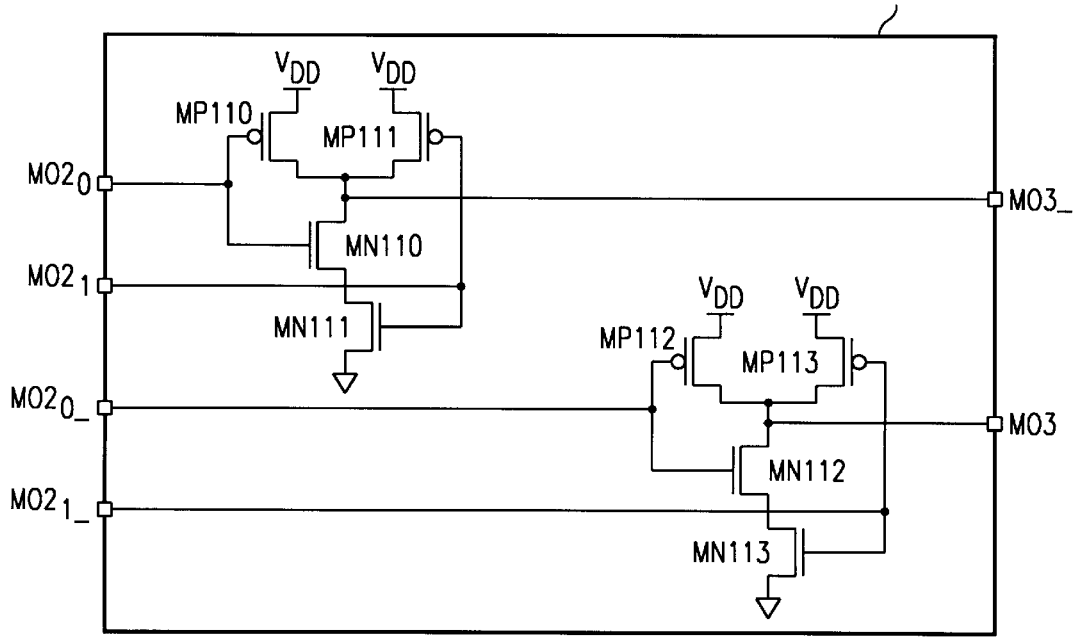
FIG. 3 is a schematic of a main output circuit MO3 used in the circuit of FIG. 1.

FIG. 3 is a schematic of a configuration example of main output circuit MO3.

As shown in FIG. 3, the main output circuit MO3 consists of PMOS transistors MP110–MP113 and NMOS transistors MN110–MN113.

The gates of PMOS transistor MP110 and NMOS transistor MN110 are connected to main output line $MO2_0$. The drains of the two transistors MP110 and MN110 and the drain of PMOS transistor MP111 are connected. The connection point between these drains is connected to main output line MO3_. The sources of PMOS transistors MP110 and MP111 are connected to the feeding line for supply voltage $V_{DD}$. The source of NMOS transistor MN110 is connected to the drain of NMOS transistor MN111, and the source of NMOS transistor MN111 is connected to the ground line. The gates of PMOS transistor MP111 and NMOS transistor MN111 are connected to main output line MO2$_1$.

The gates of PMOS transistor MP112 and NMOS transistor MN112 are connected to main output line MO2$_0$_. The drains of the two transistors MP112 and MN112 and the drain of PMOS transistor MP113 are connected. The connection point between the drains is connected to main output line MO3. The sources of PMOS transistors MP112 and MP113 are connected to the feeding line for supply voltage V$_{DD}$. The source of NMOS transistor MN112 is connected to the drain of NMOS transistor MN113, and the source of NMOS transistor MN113 is connected to the ground line. The gates of PMOS transistor MP113 and NMOS transistor MN113 are connected to main output line MO21_.

As described above, main output circuit MO3 has two NAND circuits. One NAND circuit is connected between the two main output lines MO2$_0$ and MO2$_1$ on the normal side and one main output line MO3_ on the inverted side. The other NAND circuit is connected between the two main output lines MO2$_0$_ and MO2$_1$_ on the inverted side and one main output line MO3 on the normal side.

Main output lines MO3 and MO3_ are connected to common-bus driving circuit CBD.

Figure 9:
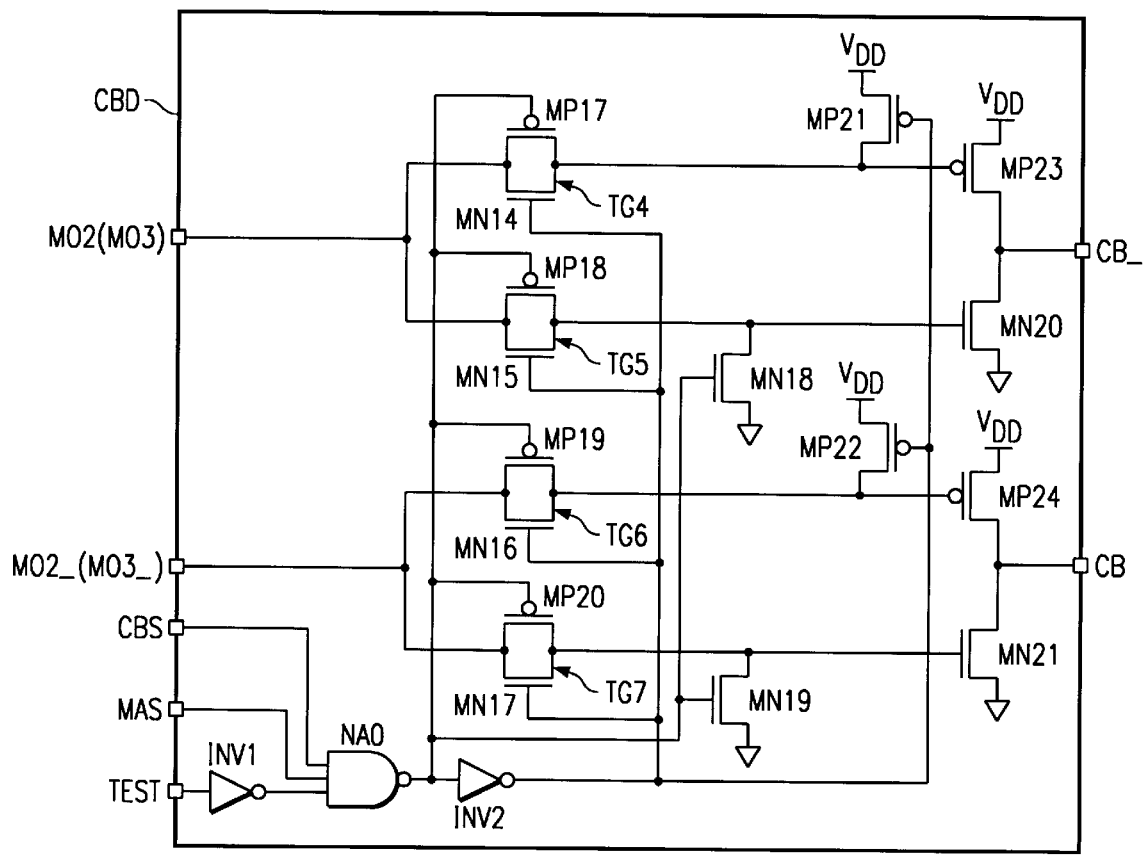
FIG. 9 is a schematic of a common-bus driving circuit CBD.
Figure 10:
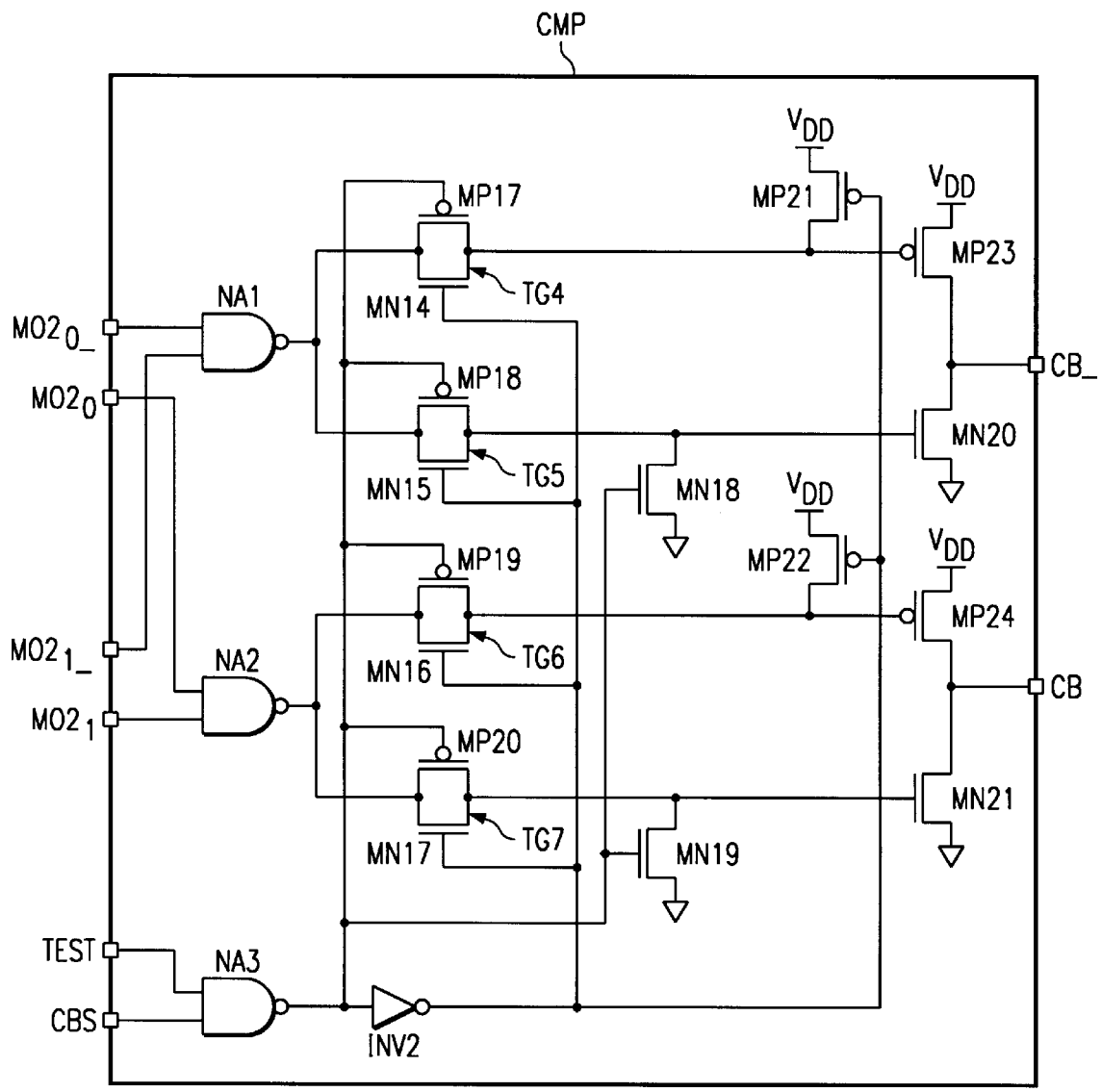
FIG. 10 is a schematic of a common-bus driving circuit CMP used in the circuit of FIG. 6.
Figure 11:
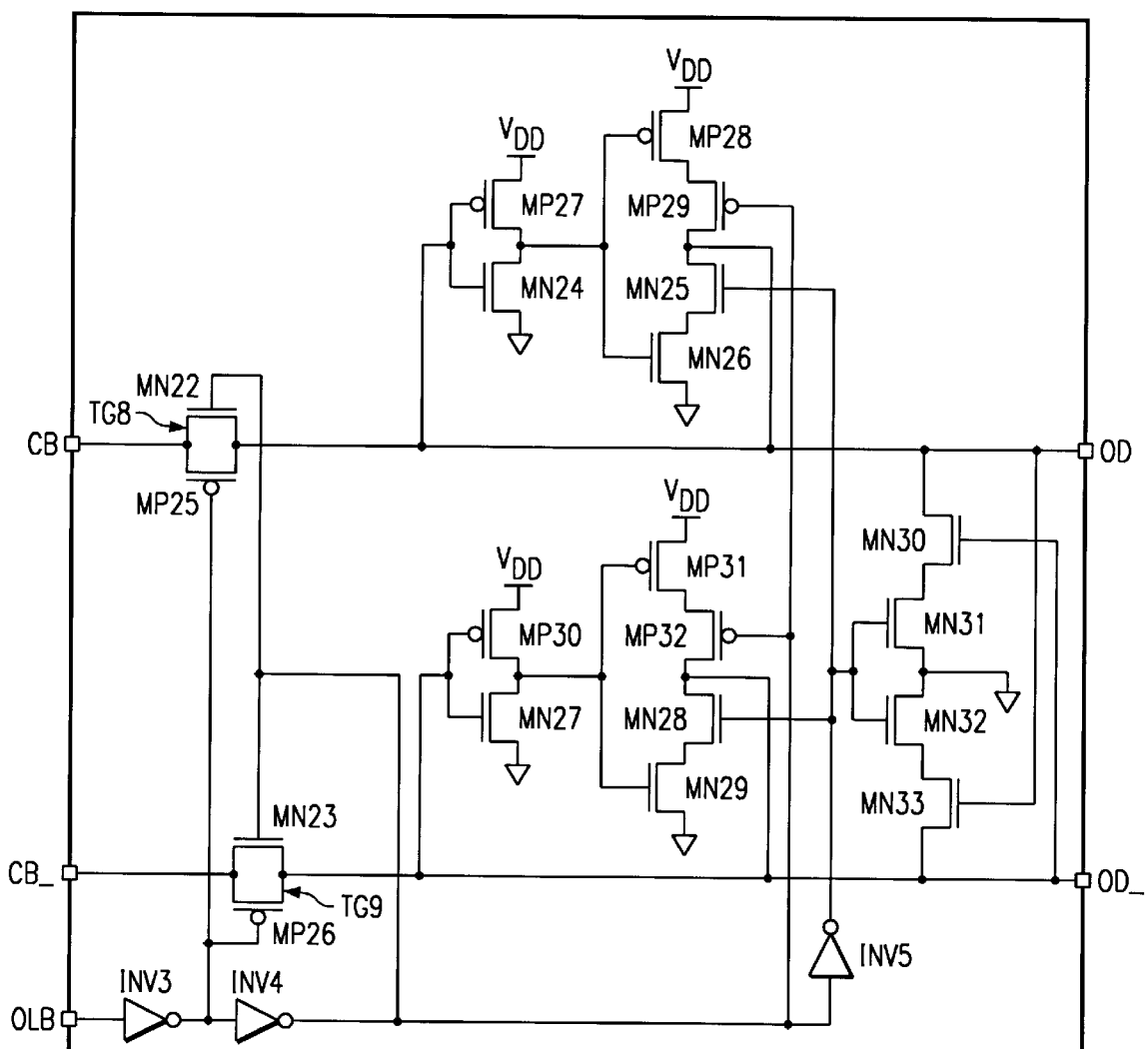
FIG. 11 is a schematic of a latching circuit ODL.
Figure 12:
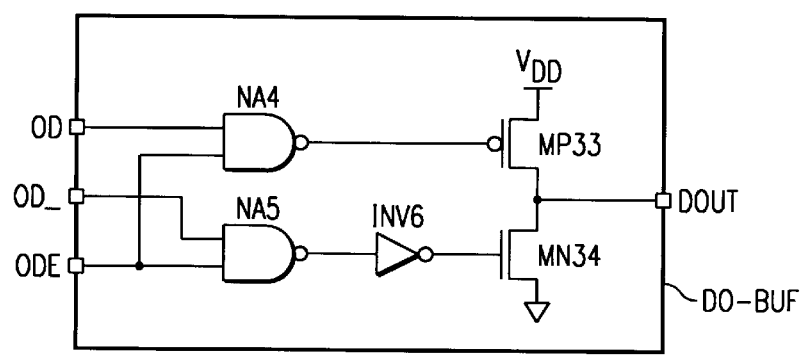
FIG. 12 is a schematic of a data output buffer DO-BUF.
Figure 13:
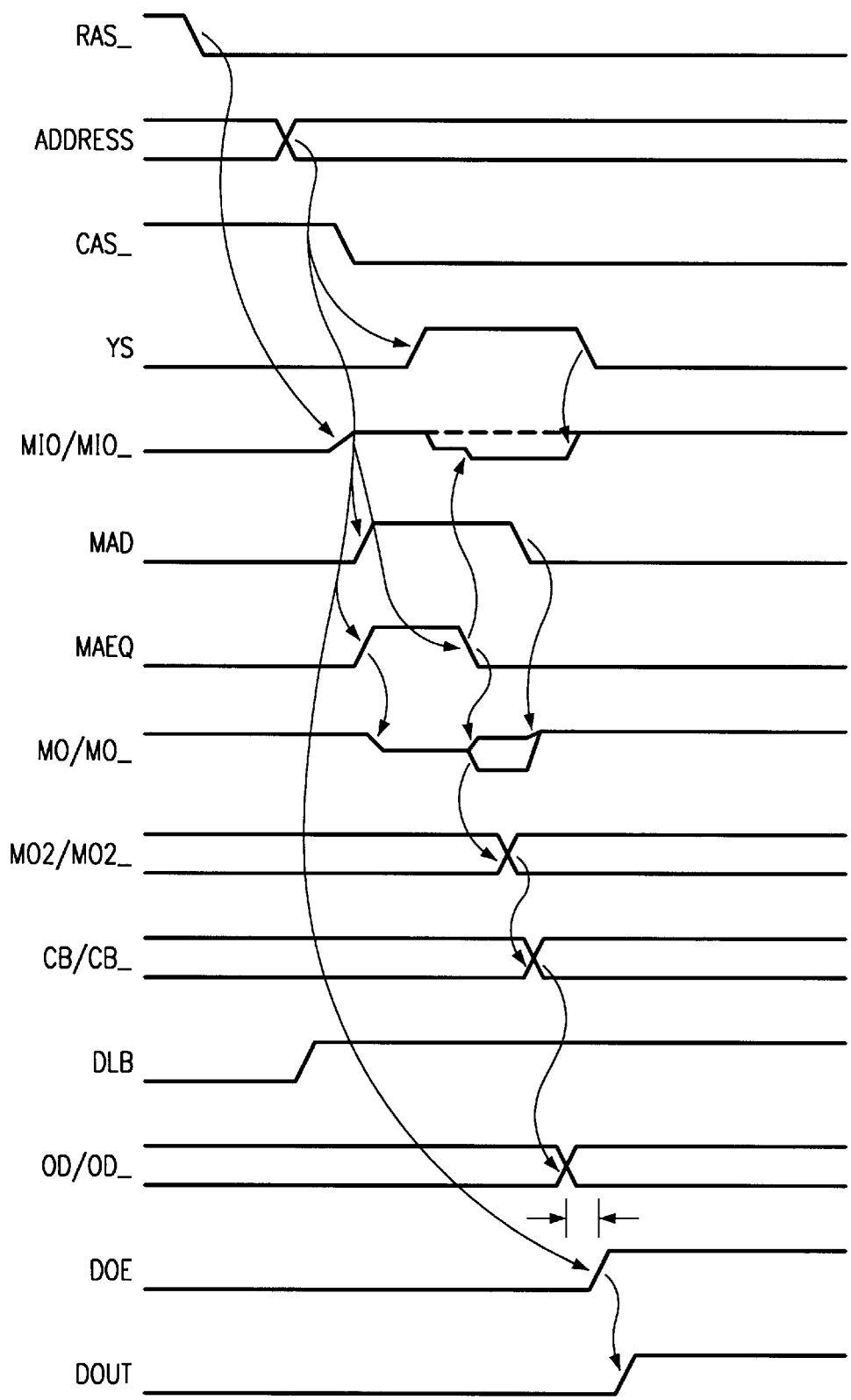
FIG. 13 is a timing chart for the circuit of FIG. 6.

Common-bus driving circuit CBD used in this embodiment has the same configuration as the circuit of FIG. 9. In this embodiment, however, because signal MAS is input to latching circuit LMO2A, a two-input NAND gate is used as NAND gate NA0. Furthermore, since only one common-bus driving circuit CBD is used instead of three common-bus driving circuits CBD$_0$, CBD$_1$, and CMP, signal TEST is not needed and NAND gate NA0 can be replaced with an inverter.

Figure 4:
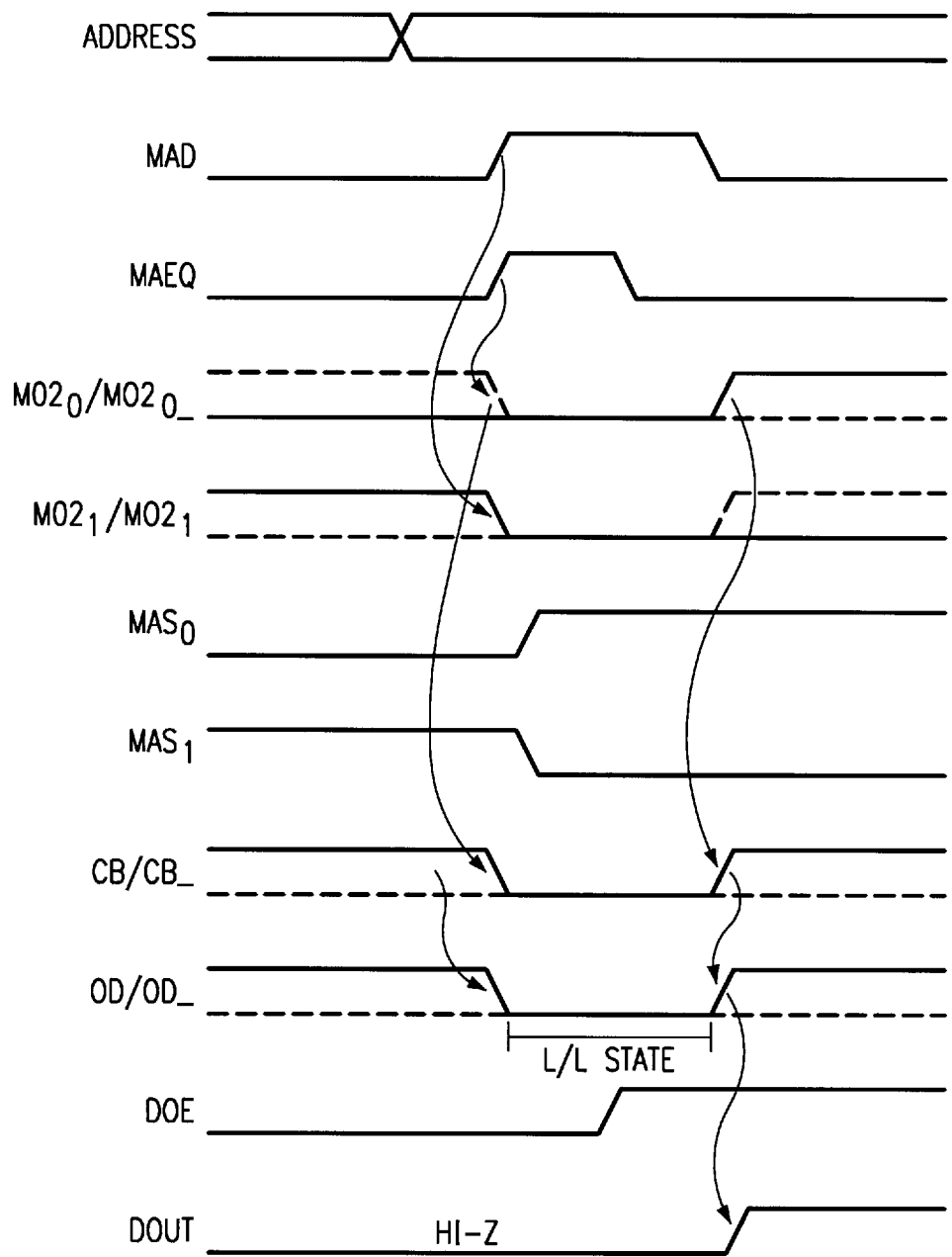
FIG. 4 is a timing chart for the circuit of FIG. 1.

In the following, the operation of this embodiment will be explained with reference to the timing chart of FIG. 4. In this case, the state before address transition takes place is exactly the same as FIG. 14.

That is, in the state before address transition takes place, main output lines MO2$_0$_ and MO2$_1$ are held at the high level "H," while main output lines MO2$_0$ and MO2$_1$_ are held at the low level "L." Signal MAS1 is selected and set to "H."

Consequently, the data on main output lines MO2$_1$/MO2$_1$_ are transmitted to common-bus CB and data output line OD through main output circuit MO3, main output lines MO3 and MO3_, and commo-bus driving circuit CBD. Common-bus CB and data output line OD are at the high level "H," while common-bus CB_ and data output line OD_ are at the low level "L."

In this embodiment, when address transition takes place, signal MAS1 goes to the low level "L" and is not selected. Signal MAS$_0$ goes to the high level "H" and is selected.

When signals MAD and MAEQ go to the high level "H" accompanying the address transition, in FIG. 2, the output of inverter INV100 goes to the high level. As a result, NMOS transistors MN108 and MN109 are turned on. Consequently, both main output lines MO2 and MO2_ are pulled to the ground level and go to the low level "L."

The data signals at the low level "L" on main output lines MO2 and MO2_ are input to main output circuit MO3. In main output circuit MO3, accompanying the input of the low-level signals, PMOS transistors MP110 and MP111, as well as PMOS transistors MP112 and MP113 in the two NAND circuits, are turned on, while NMOS transistors MN110 and MN111, as well as NMOS transistors MN112 and MN113, are turned off. As a result, the data signals at the low level "L" on main output lines MO2 and MO2_ are subjected to level inversion. Main output lines MO3 and MO3_ are pulled up to the supply voltage V$_{DD}$ level (high level). The high-level data signals are input to common-bus driving circuit CBD.

In common-bus driving circuit CBD, the high-level data signals on main output lines MO3 and MO3_ are subjected to level inversion when signal CBS is at the high level, and test signal TEST is at the low level. Consequently, both common-buses CB/CB_ and data output lines OD/OD_ go to the low level "L/L."

With data output lines OD/OD_ kept at the low level "L/L," even when signal DOE goes to the high level "H", output DOUT is still held at the high impedance (HI-Z state).

Consequently, it is also possible to activate signal DOE when data output lines OD/OD_ are in the period of "low level L/L." The timing margin for data output lines OD/OD_ in the conventional method is not needed in this embodiment.

If signal DOE is enabled earlier than transition of data output lines OD/OD_, transition of data output lines OD/OD_ is directly transferred to output DOUT. Consequently, the access time can be minimized.

Figure 14:
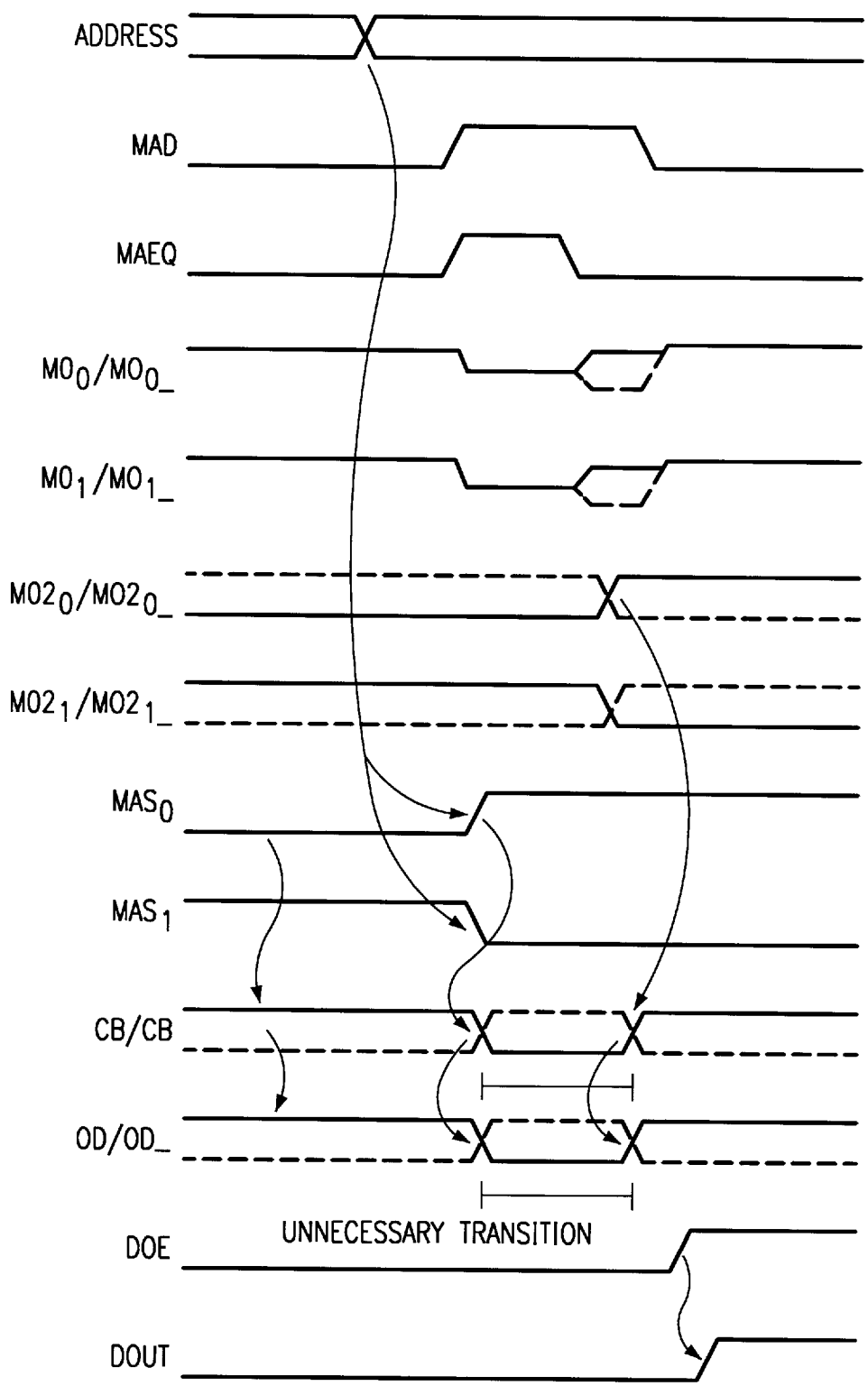
FIG. 14 is a timing chart for when signal MAS is transmitted in the circuit of FIG. 6.

Although common-buses CB/CB_ and data output lines OD/OD_ go to the low level "L/L," the number of transitions in this embodiment is less than that in the case of FIG. 14. Generation of noise can be inhibited, and the power consumption can be reduced, which are advantages.

As explained above, according to this embodiment, the address access path control circuit of our invention has latching circuit LMO2A, main output circuit MO3, and common-bus driving circuit CBD for holding the level of a pair of common-buses CB/CB_ at the ground level during a prescribed period of time in which address transition takes place while the read data is output to common-buses CB/CB_ at a timing corresponding to the address signal. The address access path control circuit of our invention also has data output buffer DO-BUF, which outputs to the outside the data transmitted from common-buses CB/CB_ to data output lines OD/OD_ in response to the input of control signal DOE. The input of control signal DOE to data output buffer DO-BUF is performed during the period in which data output lines OD/OD_ are at the ground level. Consequently, the access time can be shortened, and the layout area can be decreased. Also, the power consumption can be reduced, and noise can be decreased.

Figure 5:
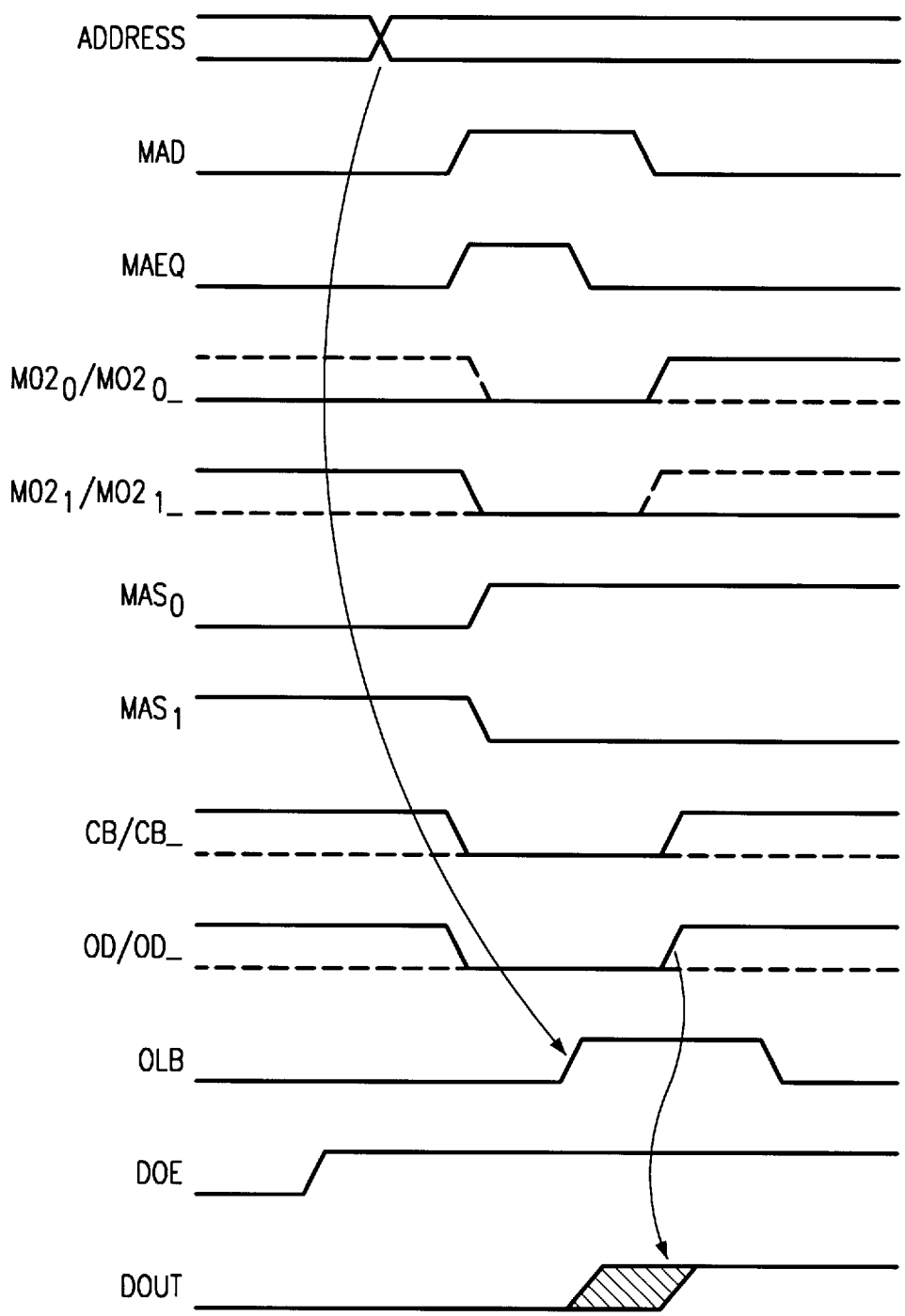
FIG. 5 is a timing chart for the circuit of FIG. 1 for operating DRAMs in extended data output (EDO) mode.

FIG. 5 shows the timing chart for the operation performed in the EDO (extended data output) mode.

In this case, signal DOE is in a constantly enabled state after RAS_ goes to the low level "L/" Switching of the output DOUT is controlled by signal OLB generated by an ATD circuit.

Even in the EDO mode, as described in the above, the access time can be shortened, and the layout area can be decreased. Also, the power consumption can be reduced, and noise can be decreased.

As explained above, according to our invention, the access time can be shortened, and the layout area can be decreased. Also, the power consumption can be reduced, and noise can be decreased.

We claim:

1. A semiconductor memory device, comprising:

a data output driver having a first and a second data input terminal, a data output terminal, and an output enable terminal, the data output driver being operable to output a data signal representative of a stored datum on the data output terminal during a read operation when the first data input terminal is at a first level, the second data input terminal is at a second level, and a signal on the output enable terminal is in an enabling state; the data output driver being further operable to cause the data output terminal to be in a high impedance state when the signal on the output enable terminal is in a disabling state or when the first and second data input terminals are both at the same first level;

a first array of memory cells for storing data;

a first logic circuit connected to the first array of memory cells for forming a data signal on a first and a second data output terminal;

a common-bus connecting the first and second data bus terminals of the first logic circuit to the first and second data input terminals of the data output driver; and wherein the first logic circuit has a control terminal, the first logic circuit being operable to form the same first level on the first and second data bus terminals when a signal on the control terminal is in an equalize state and to form the first level on the first data bus terminal and the second level on the second data bus terminal when the signal on the control terminal is not in the equalize state in response to the stored datum from a first selected cell in the first array of memory cells; whereby the signal on the output enable terminal can be switched from the disabling state to the enabling state while the signal on the control terminal of the first logic circuit is in the equalize state such that the data output terminal of the data output driver remains in a high impedance state while the signal on the control terminal of the first logic circuit is in the equalize state.

2. The memory device of claim 1, further comprises a receiving circuit coupled between the common bus and the data output driver operable to receive the data signal transferred by the common-bus from the first logic circuit during a period when the same first level is on the first and second data bus terminals of the first logic circuit.

3. The memory device of claim 2, wherein the first logic circuit further comprises:

a sense amplifier operable to sense the stored datum in the selected memory cell;

a main amplifier connected to the sense amplifier;

a latching circuit connected to the main amplifier, the latching circuit operable to latch a datum signal from the main amplifier representative of the datum sensed from the selected memory cell; and wherein the first logic circuit is operable to form a first level on the first logic circuit data bus terminal and a second level on the second logic circuit data bus terminal representative of the latched datum signal when the control terminal is not in the equalize state.

4. The memory device of claim 3, further comprising:

a second array of memory cells for storing data; and wherein the first logic circuit is further connected to the second array, the first logic circuit further comprising a second main amplifier and a second latch such that a second datum from a second selected memory cell in the second array can be sensed and latched simultaneously with the first datum from the first selected memory cell in the first array.

5. The memory device of claim 4, wherein the first logic circuit further comprises a select terminal and a main output circuit connected to receive the first latched datum and the second latched datum in a parallel manner, the main output circuit operable to pass a signal representative of either the latched first datum or the latched second datum to the first and second data bus terminals in response to a select signal on the select terminal.

6. The memory device of claim 5, wherein the main output circuit is further operable in a test mode to form a signal at a first level on the first data bus terminal and a signal at a second level on the second data bus terminal when the first latched datum is equivalent to the second latched datum, and to form a signal at the same first level on both the first and second data bus terminals when the first latched datum is different from the second latched datum; whereby in test mode the data output terminal of the data output driver will remain in a high impedance state during a read operation when the first datum and second datum are different.

7. The memory device of claim 6, further comprising:

a third and a fourth memory array, and a second logic circuit connected to the third and the fourth memory arrays, the second logic circuit having a third and a fourth data bus terminal connected to the common-bus.

\* \* \* \* \*